US008331132B2

(12) United States Patent
Cheng et al.

(10) Patent No.: US 8,331,132 B2
(45) Date of Patent: Dec. 11, 2012

(54) ADAPTIVE WRITE BIT LINE AND WORD LINE ADJUSTING MECHANISM FOR MEMORY

(75) Inventors: Hank Cheng, Taichung (TW); Ming-Zhang Kuo, Tainan County (TW); Chung-Cheng Chou, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 240 days.

(21) Appl. No.: 12/849,570

(22) Filed: Aug. 3, 2010

(65) Prior Publication Data
US 2012/0033517 A1 Feb. 9, 2012

(51) Int. Cl.
*G11C 11/24* (2006.01)
*G11C 7/00* (2006.01)
*G11C 8/00* (2006.01)

(52) U.S. Cl. .................. 365/149; 365/189.09; 365/203; 365/226; 365/230.03

(58) Field of Classification Search .................. 365/149, 365/189.09, 203, 226, 230.06, 230.03
See application file for complete search history.

(56) References Cited

U.S. PATENT DOCUMENTS

| | | | | |
|---|---|---|---|---|
| 5,056,062 A * | 10/1991 | Kuwabara et al. | ....... | 365/230.06 |
| 5,287,325 A * | 2/1994 | Morita | ...................... | 365/230.06 |
| 5,297,104 A * | 3/1994 | Nakashima | ............... | 365/230.06 |
| 5,550,775 A * | 8/1996 | Abe et al. | ................. | 365/230.06 |
| 5,666,313 A * | 9/1997 | Ichiguchi | ................. | 365/230.06 |
| 5,696,731 A * | 12/1997 | Miyamoto | ............... | 365/230.06 |
| 6,052,324 A * | 4/2000 | Tobita | ........................... | 365/149 |
| 6,141,262 A * | 10/2000 | Sudo | ........................ | 365/189.09 |
| 6,469,942 B1 * | 10/2002 | Kurihara | .................. | 365/189.09 |
| 6,525,972 B2 * | 2/2003 | Yanagisawa | ............. | 365/189.09 |
| 7,110,282 B2 * | 9/2006 | Kono et al. | .................... | 365/149 |
| 7,558,145 B2 * | 7/2009 | Rao et al. | ................. | 365/230.06 |

OTHER PUBLICATIONS

Raychowdhury, Arijit, et al., "PVT-and-Aging Adaptive Wordline Boosting fro 8T SRAM Power Reduction", ISSCC 2010, Session 19, High-Performance Embedded Memory, 19.6, 2010 IEEE International Solid-State Circuits Conference, pp. 352-353.
Fujimura, Yuki, et al., "A Configurable SRAM with Constant-Negative-Level Write Buffer for Low-Voltage Operation with 0.149 μm2 Cell in 32nm High-k Metal-Gate CMOS", ISSCC 2010, Session 19, High-Performance Embedded Memory, 19.4, 2010 IEEE International Solid-State Circuits Conference, pp. 348-349.

* cited by examiner

*Primary Examiner* — Trong Phan
(74) *Attorney, Agent, or Firm* — Lowe Hauptman Ham & Berner, LLP

(57) ABSTRACT

A memory includes a capacitor coupled to a write bit line or a word line. An initializer is configured to initialize a voltage level at a first node between the capacitor and the write bit line or a word line. An initial level adjuster is configured to adjust a voltage level of a second node at one terminal of the capacitor. A pulse generator configured to supply a pulse to the initial level adjuster to control the initial level adjuster. A boost signal is configured to be supplied to a third node on the other terminal of the capacitor opposite the first node to boost a voltage level of the write bit line lower than ground or to boost a voltage level of the word line higher than a power supply voltage.

20 Claims, 11 Drawing Sheets

US 8,331,132 B2

ADAPTIVE WRITE BIT LINE AND WORD LINE ADJUSTING MECHANISM FOR MEMORY

TECHNICAL FIELD

The present disclosure relates generally to an integrated circuit, more particularly a memory.

BACKGROUND

When a Static Random Access Memory (SRAM) operates at a low power supply voltage (VDD), its write margin limits the minimum operable power supply voltage (VCCmin). In some conventional circuits, a negative bitline (BL) writing scheme (with negative boost voltage) is used when writing a logical 0 (write 0 operation) in a memory for write margin limited SRAM under low VDD operating design. However, the negative boost voltage level relies on the VDD magnitude, and does not provide enough driving voltage difference at lower VDD. Further, under nominal VDD, the negative boost can cause stress and reliability issues. Accordingly, new circuits and methods are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
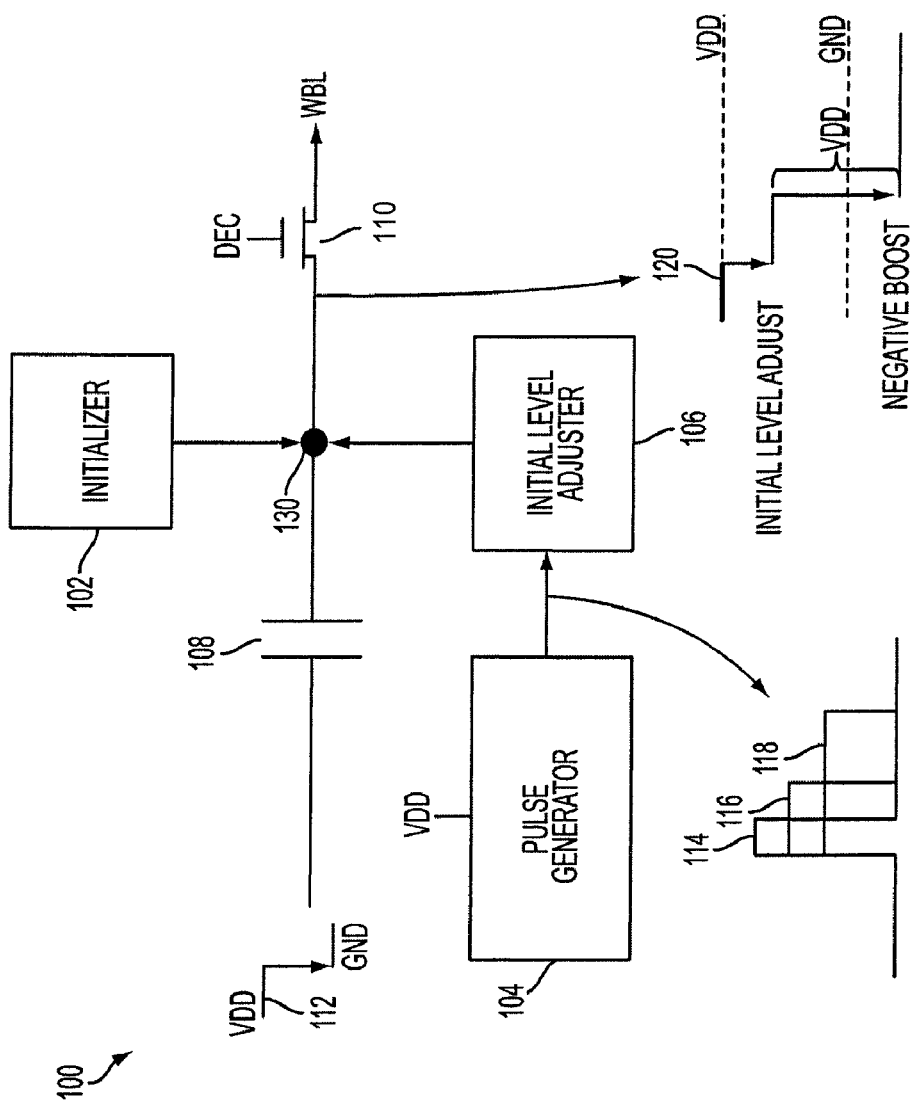
FIG. 1 is a schematic diagram showing an exemplary write bit line boost circuit for a memory according to some embodiments.

FIG. 1 is a schematic diagram showing an exemplary write bit line boost circuit for a memory according to some embodiments. The circuit 100 includes an initializer 102, a pulse generator 104, and an initial level adjuster 106, and a capacitor 108. The capacitor 108 is coupled to a write bit line (WBL) of the memory through an NMOS transistor 110 that has a decoder signal (dec) for selecting the WBL at the gate. An initializer 102, e.g., a precharge circuit, is configured to initialize a voltage level at a first node 130 between the capacitor 108 and the WBL. In this embodiment, the initializer 102 precharges the first node 130 to a power supply voltage (VDD) as shown in the signal 120.

The pulse generator 104 is coupled to VDD and configured to supply a pulse, e.g., 114, 116, or 118, to control the initial level adjuster 106. The pulse shape from the pulse generator 104 depends on the VDD value. With lower VDD, a longer (broader) pulse is generated, such as the pulse 118 compared to 114 or 116. With higher VDD, a shorter (narrower) pulse is generated, such as the pulse 114 compared to 116 or 118.

An initial level adjuster 106 is configured to adjust a voltage level of a second node at one terminal of the capacitor 108. In this embodiment, the first node 130 is the same as the second node 130. The pulse width of the pulse, e.g., 114, 116, or 118, determines the adjusting period and also the adjusted voltage level. The voltage level at the first node 130 is adjusted from VDD to a lower voltage level (that depends on VDD and the pulse width from the pulse generator 104), as shown in the signal 120. A boost signal 112 is supplied for a write 0 operation to a third node on the other side of the capacitor 108 opposite the first node 130. The boost signal 112 drops from VDD to ground and negatively boosts (drops) the voltage level at the first node 130 by VDD due to the tendency of the capacitor 108 to hold the voltage difference across it. Therefore, assuming the NMOS transistor 110 is turned on, the voltage level of the write bit line (WBL) becomes lower than ground, as shown in the signal 120.

Figure 2:
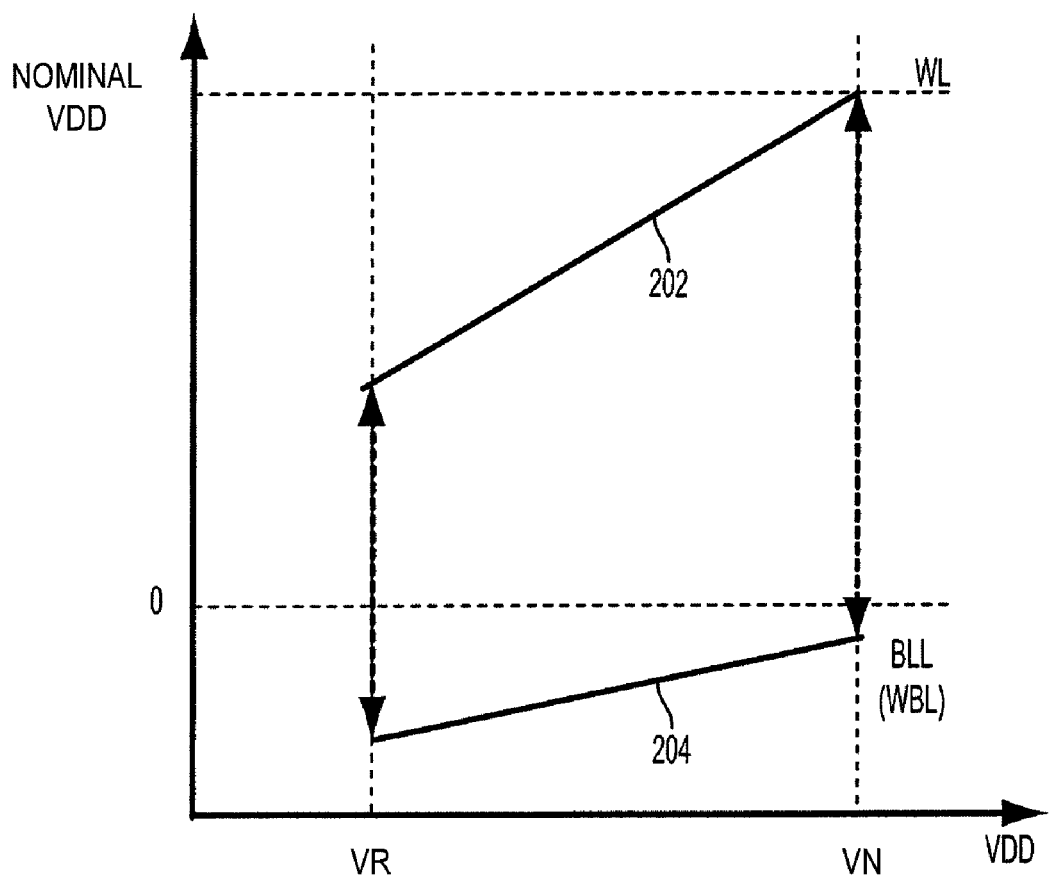
FIG. 2 is a plot showing the write bit line adjustment of the circuit in FIG. 1 according to some embodiments.

FIG. 2 is a plot showing the write bit line adjustment of the circuit in FIG. 1 according to some embodiments. If VDD is equal to a voltage level VN, the circuit 100 is operated at an normal access mode; if VDD is equal to or less than a voltage level VR, the circuit 100 is operated at an retention mode; and if VDD is between the voltage level VR and the voltage level VN, the circuit 100 is operated at a low voltage access mode. The word line (WL) voltage 202 (the same as VDD) and the bit line low (BLL), i.e., WBL when pulled low for a write 0 operation, voltage 204 are shown. BLL voltage 204 shows negative voltages with a greater magnitude at lower VDD. This is due to the longer (broader) pulse width generated from the pulse generator 104 at lower VDD. The voltage difference between WL and BLL helps to improve the VCCmin of the memory, where the memory's write margin limits the VCCmin.

Figure 3:
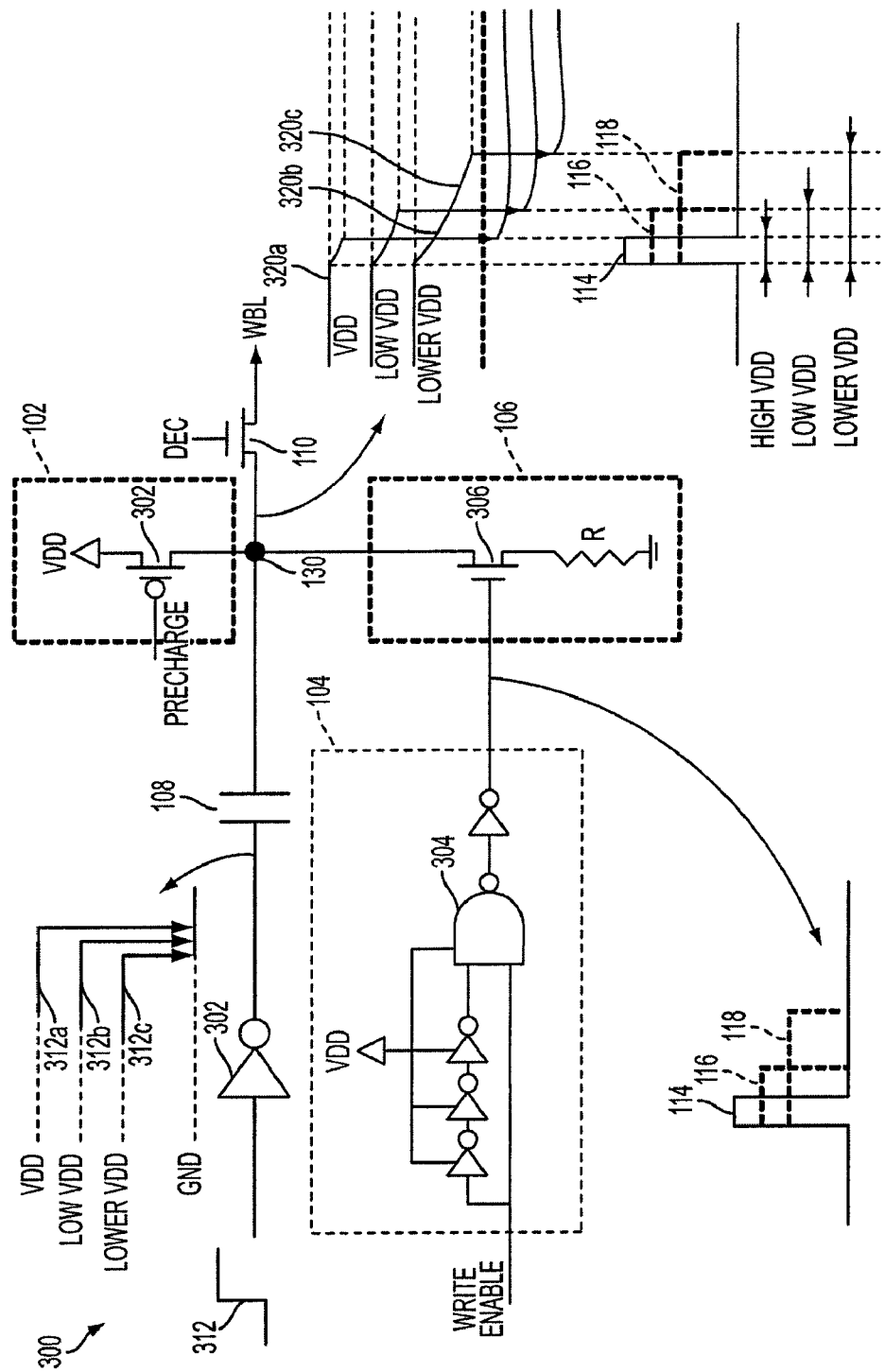
FIG. 3 is a schematic diagram showing an exemplary implementation of the write bit line boost circuit in FIG. 1 according to some embodiments.

FIG. 3 is a schematic diagram showing an exemplary implementation of the write bit line boost circuit in FIG. 1 according to some embodiments. In the circuit 300, an inverter 302 is used as buffer for the boost signals 312a, 312b, and 312c, that corresponds for different VDD values. (The boost signals 312a, 312b, and 312c are inverted signals from the boost control signal 312.) The initializer 102 is implemented as a precharge circuit with a PMOS transistor 302 coupled to VDD and controlled by a precharge control signal. The pulse generator 104 has a write enable signal input that is coupled to one input of a NAND gate 304 through three inverters, and also directly coupled to the other input of the NAND gate 304. The NAND gate 304's output goes through another inverter to be coupled to the gate of an NMOS transistor 306 in the initial level adjuster 106.

When the pulse, e.g., 114, 116, or 118, generated by the pulse generator 104 has a logical 1, the NMOS transistor 306 is turned on during the pulse's duration (pulse width) to pull down the voltage level at the node 130 through a resistor R. Therefore, the pulse duration determines the amount by which the voltage level at the node 130 is pulled down by the initial level adjuster 106. The voltages at the node 130 are shown by exemplary signals 320*a*, 320*b*, and 320*c* for different exemplary pulses 114, 116, and 118, respectively.

The signals 320*a*, 320*b*, and 320*c* are initially precharged to VDD. The signal 320*a* shows a small voltage pulled down from VDD due to the short pulse 114 generated using (relatively high) VDD. This results in a relatively small negative boost on the signal 320*a*. The signal 320*c* shows a larger voltage pulled down from VDD due to the longer pulse 118 generated using lower VDD. This results in a relatively larger negative boost on the signal 320*c*. (This trend is also shown in FIG. 2.)

Figure 4:
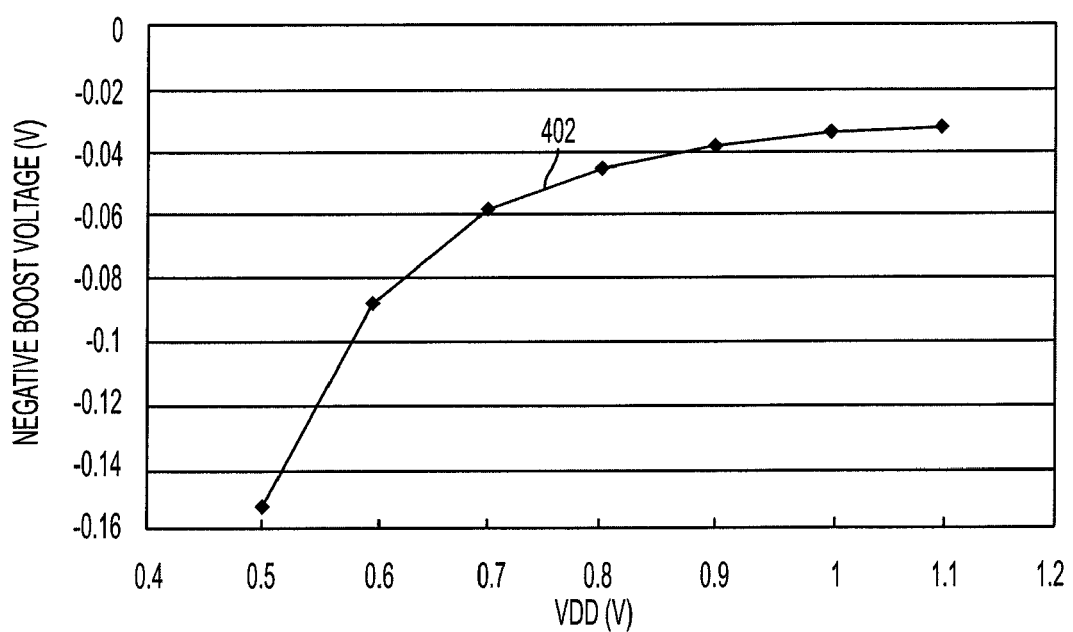
FIG. 4 is a plot showing the negative boost voltage versus the power supply voltage (VDD) of the write bit line boost circuit in FIG. 3 according to some embodiments.

FIG. 4 is a plot showing the negative boost voltage versus the power supply voltage (VDD) of the write bit line boost circuit in FIG. 3 according to some embodiments. The negative boost voltage 402 shows a greater magnitude for the lower VDD, and result in the overall bit line/word line voltages as indicated in FIG. 2.

Figure 5:
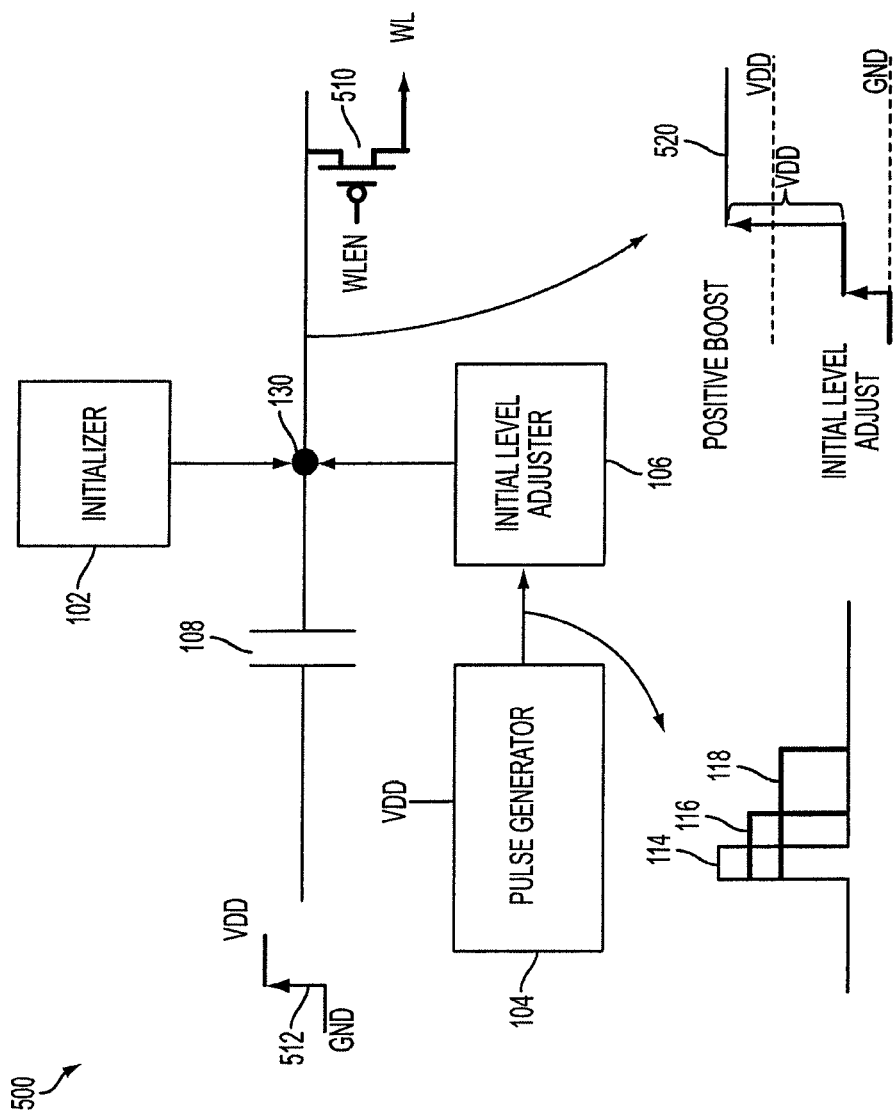
FIG. 5 is a schematic diagram showing an exemplary word line boost circuit for a memory according to some embodiments.

FIG. 5 is a schematic diagram showing an exemplary word line boost circuit for a memory according to some embodiments. The circuit 500 in FIG. 5 is similar to the circuit 100 in FIG. 1, except a word line (WL) is coupled through a PMOS transistor 510 to the first node 130 instead of the write bit line (WBL) coupled through an NMOS transistor 110. The PMOS transistor 510 is enabled by the word line enable (wlen) signal. In the circuit 500, the initializer 102 in circuit 500 sets the voltage level at the first node 130 to ground, e.g., by pulling down using an NMOS transistor (not shown), instead of precharging it to VDD.

The voltage level at the first node 130 is adjusted from ground to a higher voltage level (that depends on VDD and the pulse width from the pulse generator 104), as shown in the signal 520. A boost signal 512 rises from ground to VDD and positively boosts (raises) the voltage level at the first node 130 by VDD due to the tendency of the capacitor 108 to hold the voltage difference across it. Therefore, assuming the PMOS transistor 510 is turned on, the voltage level of the word line (WL) becomes higher than VDD, as shown in the signal 520. This helps to improve the write margin that limits VCCmin. In some embodiments, the WL voltage is boosted whenever the WL is asserted, i.e., when there is a read or write operation.

Figure 6:
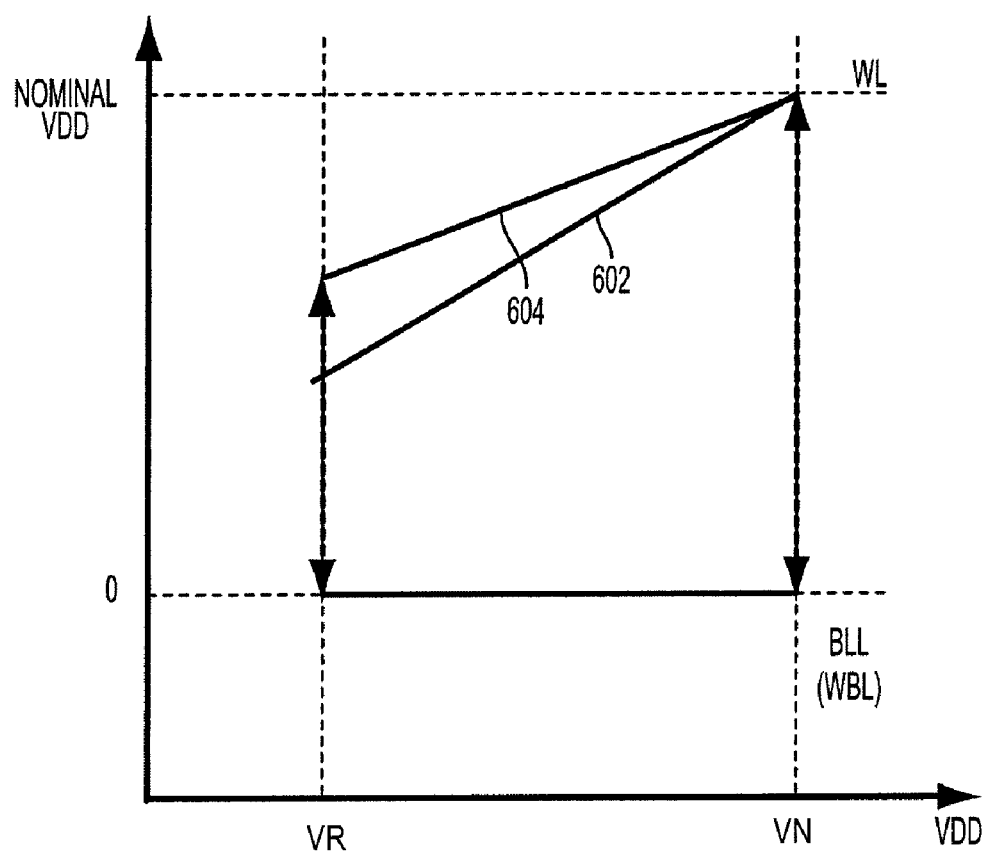
FIG. 6 is a plot showing the word line adjustment of the circuit in FIG. 5 according to some embodiments.

FIG. 6 is a plot showing the word line adjustment of the circuit in FIG. 5 according to some embodiments. The description of the reference characters that are similar to or the same as those depicted in FIG. 2 is omitted. The WL signal 604 has a positive boost compared to the conventional WL signal 602, and the amount of the positive boost (the difference between signals 602 and 604) is greater for lower VDD.

Figure 7:
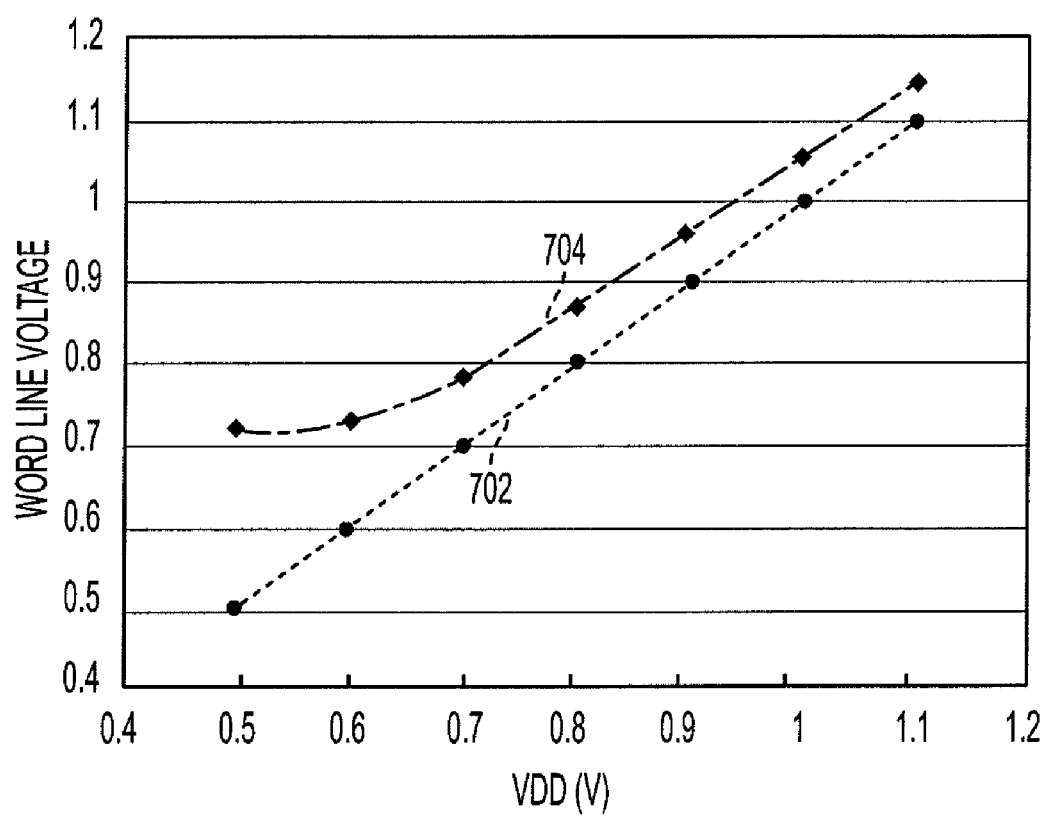
FIG. 7 is a plot showing the word line voltage versus the power supply voltage (VDD) of the word line boost circuit in FIG. 5 according to some embodiments.

FIG. 7 is a plot showing the word line voltage versus the power supply voltage (VDD) of the word line boost circuit in FIG. 5 according to some embodiments. The positively boosted WL signal 704 has a greater positive boost for lower VDD, compared to the conventional WL signal 702.

Figure 8:
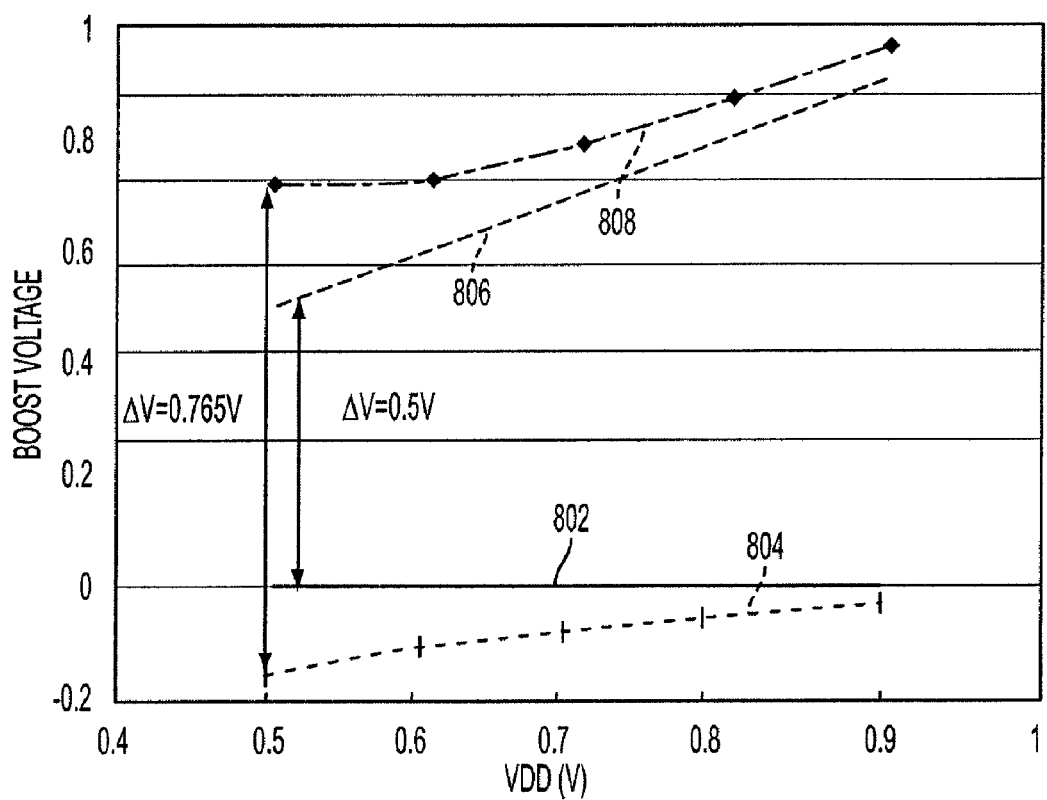
FIG. 8 is a plot showing the write bit line voltage and the word line voltage versus the power supply voltage (VDD) when the write bit line boost circuit in FIG. 1 and the word line boost circuit in FIG. 5 are both implemented according to some embodiments.

FIG. 8 is a plot showing the write bit line voltage and the word line voltage versus the power supply voltage (VDD) when the write bit line boost circuit in FIG. 1 and the word line boost circuit in FIG. 5 are both implemented according to some embodiments. The negatively boosted write bit line signal 804 according to the circuit in FIG. 1 has a greater negative boost for lower VDD, compared to the conventional write bit line signal 802. Also, the positively boosted WL signal 808 according to the circuit in FIG. 5 has a greater positive boost for lower VDD, compared to the conventional WL signal 806. With VDD at about 0.5 V, a conventional circuit provides a voltage difference of 0.5 V between the WL signal 806 and the write bit line signal 802. Using the write bit line boost circuit in FIG. 1 and the word line boost circuit in FIG. 5, the voltage difference is increased to about 0.765 V.

Figure 9:
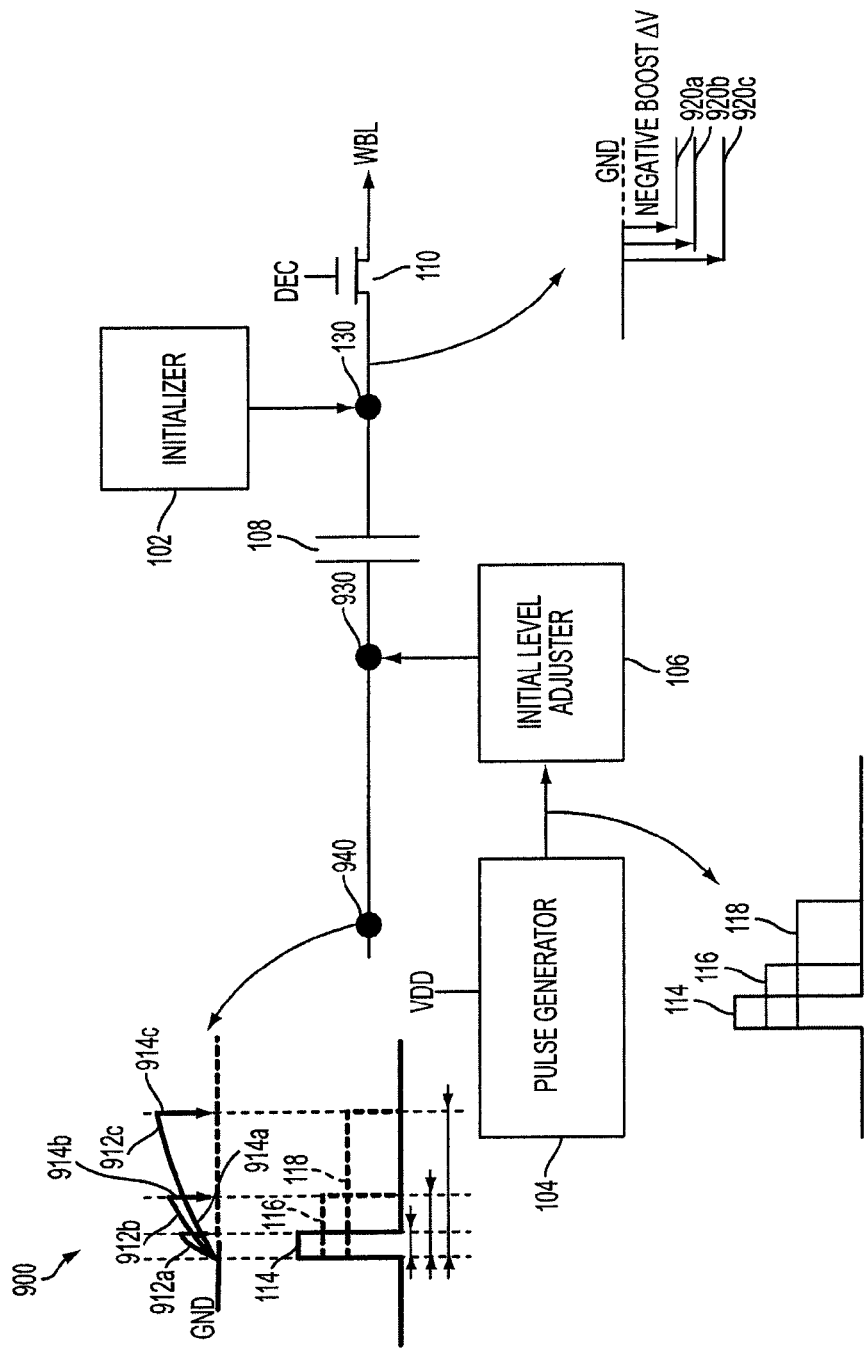
FIG. 9 is a schematic diagram showing another exemplary write bit line boost circuit for a memory according to some embodiments.

FIG. 9 is a schematic diagram showing another exemplary write bit line boost circuit for a memory according to some embodiments. The circuit 900 has similar components to the circuit 100, e.g., an initializer 102, a pulse generator 104, and an initial level adjuster 106, and a capacitor 108, but some components are connected differently. An initializer 102 is configured to initialize a voltage level at the first node 130 between the capacitor 108 and the write bit line (WBL). In the circuit 900, the initializer 102 sets the first node 130 to a ground (GND) voltage level.

An initial level adjuster 106 is configured to adjust a voltage level of a second node 930 at one terminal of the capacitor 108. In this embodiment, the second node 930 is on the other side of the capacitor 108 opposite the first node 130. The pulse width of the pulse, e.g., 114, 116, or 118, determines the adjusting period and the adjusted voltage level. The voltage level at the second node 130 is adjusted from GND to a lower voltage level (that depends on VDD and the pulse width from the pulse generator 104), as shown in the signal 920*a*, 920*b*, and 920*c*, that corresponds to pulses 114, 116, and 118, respectively.

The voltage level at the second node 930 is adjusted from GND to a higher voltage level (that depends on the pulse width from the pulse generator 104), as shown in the signal 912*a*, 912*b*, or 912*c*. A boost signal 914*a*, 914*b*, or 914*c* (that corresponds to pulses 114, 116, or 118, respectively) is supplied for a write 0 operation to a third node 940 on the other side of the capacitor 108 opposite the first node 130. In this embodiment, the third node 940 and the second node 930 can be the same. The boost signal 914*a*, 914*b*, or 914*c* drops the voltage at the first node 130 from GND to negative boost voltage ΔV. Therefore, assuming the NMOS transistor 110 is turned on, the voltage level of the write bit line (WBL) becomes lower than ground, as shown in the signals 920*a*, 920*b*, or 920*c* that corresponds to the pulse 114, 116, or 118, respectively.

Figure 10:
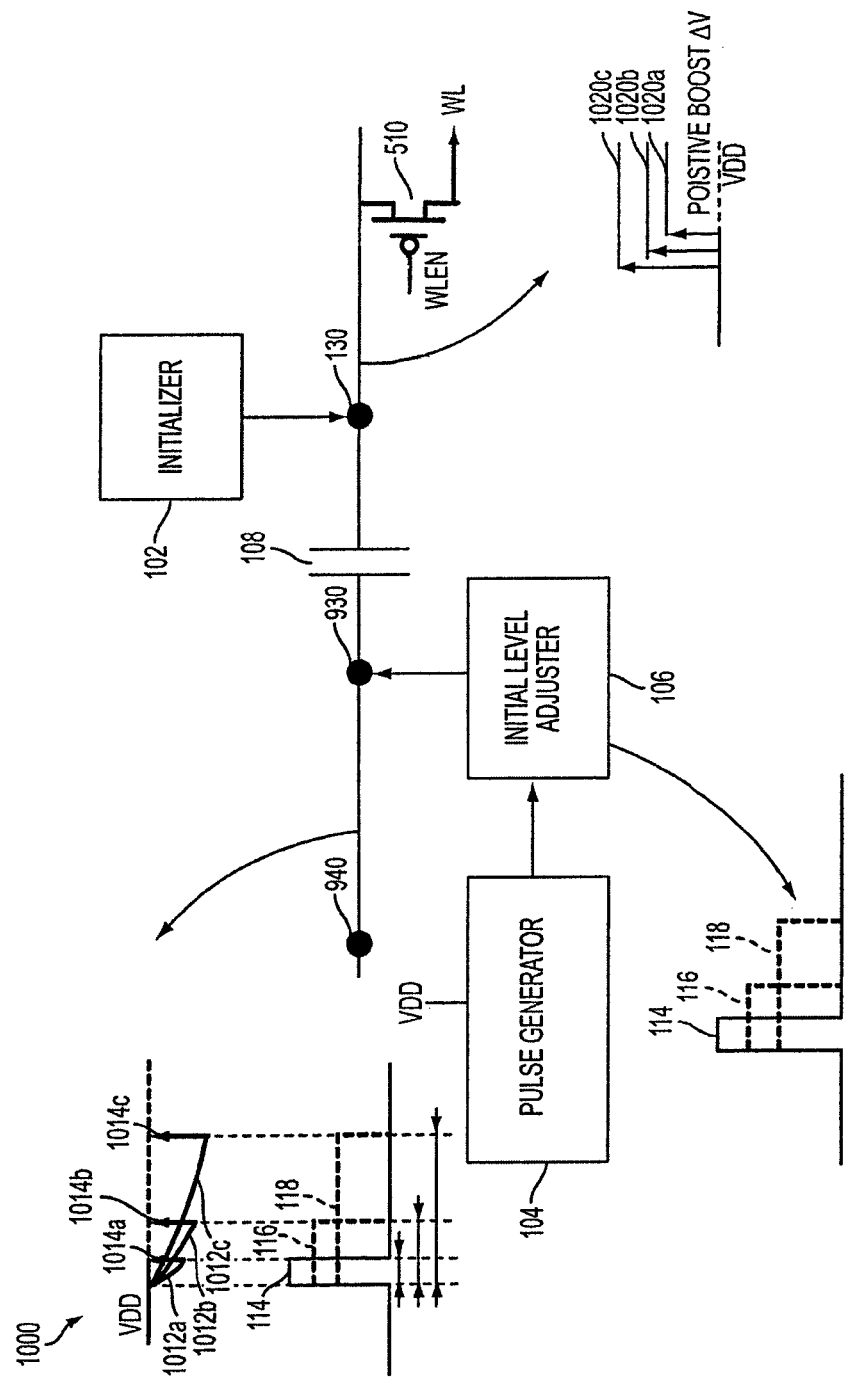
FIG. 10 is a schematic diagram showing another exemplary word line boost circuit for a memory according to some embodiments.

FIG. 10 is a schematic diagram showing another exemplary word line boost circuit for a memory according to some embodiments. The circuit 1000 in FIG. 10 is similar to the circuit 900 in FIG. 9, except a word line (WL) is coupled through a PMOS transistor 510 to the first node 130 instead of the write bit line (WBL) coupled through an NMOS transistor 110. The PMOS transistor 510 is enabled by the word line enable (wlen) signal. Also, the initializer 102 sets the voltage level at the first node 130 to VDD, e.g., by pulling up using a PMOS transistor (not shown) to precharge to VDD.

The voltage level at the second node 930 is adjusted from VDD to a lower voltage level (that depends on VDD and the pulse width from the pulse generator 104), as shown in the signal 1012*a*, 1012*b*, or 1012*c*. A boost signal 1014*a*, 1014*b*, or 1014*c* pulls the voltage level at the third node 940 to VDD, e.g., by using a pull up PMOS transistor (not shown), to boost (raise) the voltage level at the first node 130 by a positive boost voltage ΔV. Therefore, assuming the PMOS transistor 510 is turned on, the voltage level of the word line (WL) becomes higher than VDD, as shown in the signal 1020*a*, 1020b, or 1020c, that corresponds to the pulse 114, 116, or 118, respectively. This helps to improve the write margin that limits VCCmin. In some embodiments, the WL voltage is boosted whenever the WL is asserted, i.e., when there is a read or write operation.

Figure 11:
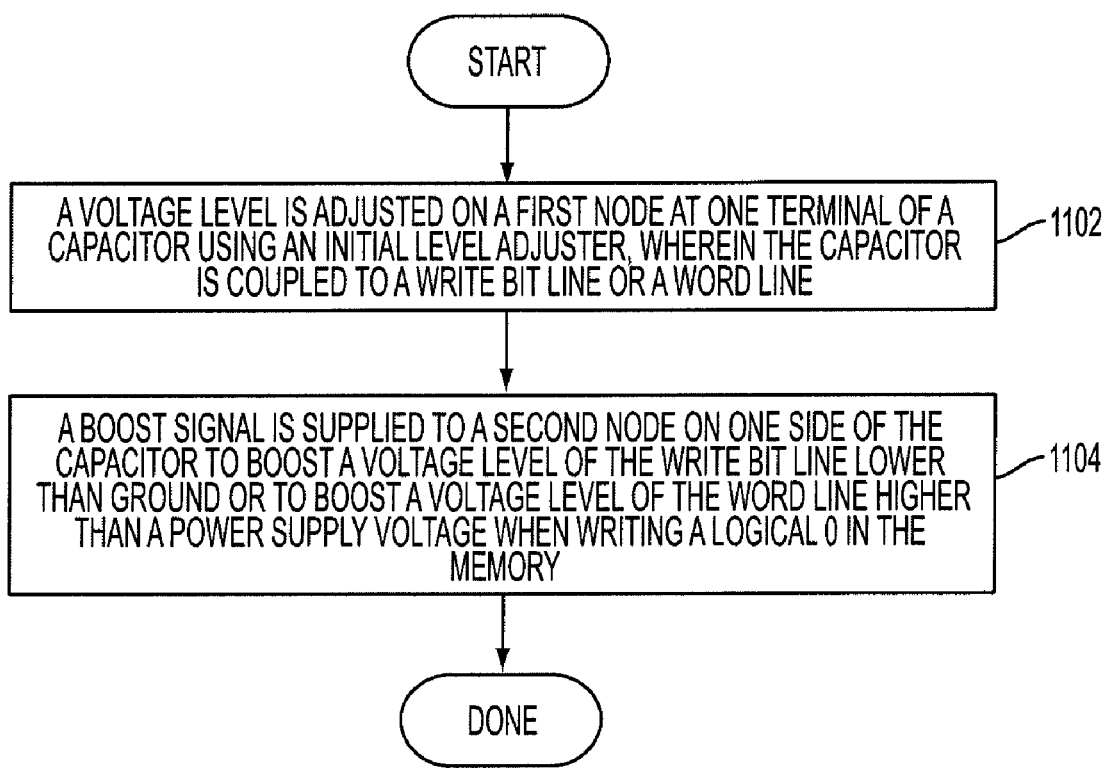
FIG. 11 is a flowchart for a method of the exemplary circuit in FIG. 1, FIG. 5, FIG. 9, or FIG. 10 according to some embodiments.

FIG. 11 is a flowchart for a method of the exemplary circuit in FIG. 1, FIG. 5, FIG. 9, or FIG. 10 according to some embodiments. At step 1102, a voltage level is adjusted on a first node at one terminal of a capacitor, e.g., 108, using an initial level adjuster, e.g., 106, wherein the capacitor, e.g., 108, is coupled to a write bit line (WBL) or a word line (WL). At step 1104, a boost signal is supplied to a second node on one side of the capacitor, e.g., 108, to boost a voltage level of the WBL lower than ground or to boost a voltage level of the WL higher than a power supply voltage, e.g., VDD.

The method can further include initializing a voltage level at a third node between the capacitor, e.g., 108, and the WBL or WL. For example, the voltage level at the third node can be precharged to the power supply voltage, or grounded. The method can further include generating a pulse by a pulse generator, e.g., 104, coupled to the initial level adjuster, e.g., 106. The method can further include controlling the initial level adjuster, e.g., 106, with the pulse. The method can include generating the pulse comprises generating a broader pulse width when the pulse generator is coupled to a lower power supply voltage. In some embodiments, the boosted voltage level of the WBL is lower or the boosted voltage level of the WL is higher when the pulse has a broader pulse width.

According to some embodiments, a memory includes a capacitor coupled to a write bit line or a word line. An initializer is configured to initialize a voltage level at a first node between the capacitor and the write bit line or a word line. An initial level adjuster is configured to adjust a voltage level of a second node at one terminal of the capacitor. A pulse generator configured to supply a pulse to the initial level adjuster to control the initial level adjuster. A boost signal is configured to be supplied to a third node on the other side of the capacitor from the first node to boost a voltage level of the write bit line lower than ground or to boost a voltage level of the word line higher than a power supply voltage.

According to some embodiments, a method for a memory includes adjusting a voltage level on a first node at one terminal of the capacitor using an initial level adjuster, wherein the capacitor is coupled to a write bit line or a word line. A boost signal is supplied to a second node on one side of the capacitor to boost a voltage level of the write bit line lower than ground or to boost a voltage level of the word line higher than a power supply voltage.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory, comprising:
    a capacitor coupled to a write bit line or a word line;
    an initializer configured to initialize a voltage level at a first node between the capacitor and the write bit line or the word line;
    an initial level adjuster configured to adjust a voltage level of a second node at one terminal of the capacitor; and
    a pulse generator configured to supply a pulse to the initial level adjuster to control the initial level adjuster;
    wherein a boost signal configured to be supplied to a third node on the other terminal of the capacitor opposite the first node to boost a voltage level of the write bit line lower than ground or to boost a voltage level of the word line higher than a power supply voltage.

2. The memory of claim 1, wherein the pulse generator is configured to supply a broader pulse width when coupled to a lower power supply voltage.

3. The memory of claim 1, wherein the initializer is a precharge circuit configured to initialize the voltage level at the first node to the power supply voltage.

4. The memory of claim 1, wherein initializer is configured to initialize the voltage level at the first node to a ground level.

5. The memory of claim 1, wherein the second node and the third node are the same node.

6. The memory of claim 1, wherein the boosted voltage level of the write bit line is lower or the boosted voltage level of the word line is higher when the pulse has a broader pulse width.

7. The memory of claim 1, wherein the pulse generator comprises NAND gate and an odd number of inverters coupled to one input of the NAND gate.

8. The memory of claim 1, wherein the initial level adjuster comprises a transistor and a resistor.

9. A memory, comprising:
    a capacitor coupled to a write bit line or a word line;
    an initializer configured to initialize a voltage level at a first node between the capacitor and the write bit line or a word line;
    an initial level adjuster configured to adjust a voltage level of a second node at one terminal of the capacitor, wherein the initial level adjuster comprises a transistor and a resistor; and
    a pulse generator configured to supply a pulse to the initial level adjuster to control the initial level adjuster, the pulse having a broader pulse width when coupled to a lower power supply voltage, wherein the pulse generator comprises a NAND gate and an odd number of inverters coupled to one input of the NAND gate,
    wherein a boost signal configured to be supplied to a third node on the other terminal of the capacitor opposite the first node to boost a voltage level of the write bit line lower than ground or boost a voltage level of the word line higher than the power supply voltage.

10. The memory of claim 9, wherein the initializer is a precharge circuit configured to initialize the voltage level between the capacitor and the write bit line or a word line.

11. The memory of claim 9, wherein the boosted voltage level of the write bit line is lower or the boosted voltage level of the word line is higher when the pulse has a broader pulse width.

12. A method of biasing a write bit line or a word line for a memory comprising:
   adjusting a voltage level on a first node at one terminal of a capacitor using an initial level adjuster, wherein the capacitor is coupled to the write bit line or the word line; and
   supplying a boost signal to a second node on one side of the capacitor to boost a voltage level of the write bit line lower than ground or to boost a voltage level of the word line higher than a power supply voltage.

13. The method of claim 12, further comprising initializing a voltage level at a third node between the capacitor and the write bit line or the word line.

14. The method of claim 13, wherein initializing the voltage level comprises precharging the voltage level at the third node to the power supply voltage.

15. The method of claim 13, wherein initializing the voltage level comprises grounding the voltage level at the third node.

16. The method of claim 12, further comprising generating a pulse by a pulse generator coupled to the initial level adjuster.

17. The method of claim 16, further comprising controlling the initial level adjuster with the pulse.

18. The method of claim 16, wherein generating the pulse comprises generating a broader pulse width when the pulse generator is coupled to a lower power supply voltage.

19. The method of claim 16, wherein the pulse generator comprises a NAND gate and an odd number of inverters coupled to one input of the NAND gate.

20. The method of claim 12, wherein the boosted voltage level of the write bit line is lower or the boosted voltage level of the word line is higher when the pulse has a broader pulse width.

* * * * *